United States Patent
Ng et al.

(10) Patent No.: US 6,954,537 B2
(45) Date of Patent: Oct. 11, 2005

(54) POWER-OFF NOISE SUPPRESSION CIRCUIT AND ASSOCIATED METHODS FOR AN AUDIO AMPLIFIER DEVICE

(75) Inventors: Solomon Ng, Tai Po (HK); Wen Li Luo, Shenzhen (CN)

(73) Assignee: Shenzhen STS Microelectronics Co., Ltd. (CN)

( * ) Notice: Subject to any disclaimer, the term of this patent is extended or adjusted under 35 U.S.C. 154(b) by 648 days.

(21) Appl. No.: 10/038,848

(22) Filed: Dec. 31, 2001

(65) Prior Publication Data

US 2002/0141603 A1 Oct. 3, 2002

(30) Foreign Application Priority Data

Feb. 10, 2001 (CN) .......................................... 01104517 A

(51) Int. Cl.$^7$ .......................... H04B 15/00; H03F 21/00
(52) U.S. Cl. ...................... 381/94.5; 381/120; 330/149
(58) Field of Search ................................ 381/120, 94.5, 381/94.1, 94.7, 94.8, 123; 330/123, 127, 261, 269, 273, 279, 149, 296; 323/299

(56) References Cited

U.S. PATENT DOCUMENTS

| | | | |
|---|---|---|---|
| 4,015,215 A | | 3/1977 | Seki .............................. 330/15 |
| 4,673,889 A | * | 6/1987 | Cini et al. ...................... 330/10 |
| 5,255,094 A | * | 10/1993 | Yong et al. ................... 348/632 |
| 5,307,025 A | | 4/1994 | Colvin et al. ................ 330/267 |
| 5,420,535 A | * | 5/1995 | Nebuloni et al. ............. 330/51 |
| 5,703,528 A | * | 12/1997 | Nebuloni et al. ............. 330/51 |
| 5,740,453 A | | 4/1998 | Lada, Jr. ...................... 395/750 |
| 5,768,601 A | * | 6/1998 | Tran ........................... 713/300 |
| 5,796,851 A | * | 8/1998 | Hewitt et al. ............... 381/94.5 |
| 5,818,299 A | * | 10/1998 | Tran ........................... 330/149 |
| 6,041,416 A | | 3/2000 | Lada, Jr. ...................... 713/330 |

* cited by examiner

Primary Examiner—Xu Mei
(74) Attorney, Agent, or Firm—Lisa K. Jorgenson; Christopher F. Regan

(57) ABSTRACT

An audio amplifier device includes a power supply having an output for providing a supply voltage, a voltage divider connected to the output of the power supply for providing a divided supply voltage, and an audio amplifier that further includes a supply voltage rejection circuit. The audio amplifier has a first input for receiving an input audio signal, a second input for receiving the supply voltage, a third input for receiving a supply voltage rejection signal for the supply voltage rejection circuit, and an output for providing an output audio signal. A power-off noise suppression circuit has a first input for receiving the divided supply voltage and an output for providing the supply voltage rejection signal. The power-off noise suppression circuit sets the supply voltage rejection signal equal to the divided supply voltage during power-off of the power supply so that a rate of decrease of the supply voltage is greater than a rate of decrease of the supply voltage rejection signal for reducing noise in the output audio signal during the power-off.

28 Claims, 5 Drawing Sheets

US 6,954,537 B2

POWER-OFF NOISE SUPPRESSION CIRCUIT AND ASSOCIATED METHODS FOR AN AUDIO AMPLIFIER DEVICE

FIELD OF THE INVENTION

The present invention relates to the field of electronics, and, more particularly, to an audio amplifier device.

BACKGROUND OF THE INVENTION

In some power supplies, the supply voltage $V_{cc}$ power-off time is fairly long. The rate of decrease from $V_{cc}$ to 0 depends on the capacitive and inductive load of the power supply. A typical power-off time for a power supply providing a supply voltage to a sound card in a computer system or cellular telephone is about 120 ms to go from 12 to 0.5 volts, for example. A problem associated with such an audio amplifier is a loud popping noise generated by the amplifier as the supply voltage is switched-off.

One approach to reduce or minimize power-off noise will now be discussed with reference to FIG. 1. A Class B audio amplifier 20 is connected to a 12 volt power supply 22. The audio amplifier 20 includes an input for receiving an audio input signal $V_I$ and an output for providing an amplified audio output signal $V_{OUT}$. A speaker 24 is connected to the output of the audio amplifier 20.

The audio amplifier 20 typically includes a supply voltage rejection circuit 28 (FIG. 2) for suppressing noise from the power supply 22. The audio amplifier 20 thus includes an input for receiving a supply voltage rejection signal $V_{SVR}$ for the supply voltage rejection circuit. The capacitors $C_{IN}$, $C_P$, $C_S$ and $C_{OUT}$ are external capacitors to the audio amplifier 20. To reduce the power-off noise heard at the speaker 24, transistors Q1 and Q2 are connected to the power supply 22, to the input of the audio amplifier 20 receiving the supply voltage rejection signal $V_{SVR}$, and to the output of the audio amplifier providing the amplified audio output signal $V_{OUT}$.

The transistor Q1 includes a base terminal connected to the power supply 22, a collector terminal connected to the base terminal of transistor Q2, and an emitter terminal connected to the input of the audio amplifier 20 receiving the supply voltage rejection signal $V_{SVR}$. Transistor Q2 includes a collector terminal connected to the output of the amplifier 20, and an emitter terminal connected to a voltage reference, such as ground. When a rate of decrease of the supply voltage $V_{CC}$ is greater than a rate of decrease of the supply voltage rejection signal $V_{SVR}$, i.e., $V_{CC} > V_{SVR}$, transistors Q1 and Q2 are turned on. This causes the output of the amplifier 20 to be shorted and the output noise is thus minimized.

However, when the supply voltage $V_{CC}$ does not decrease as fast as the supply voltage rejection signal $V_{SVR}$, i.e., $V_{SVR} > V_{CC}$, transistors Q1 and Q2 will not be turned on. The supply voltage rejection circuit 28 of the amplifier 20 is still active. When the supply voltage $V_{CC}$ is larger than $V_{SVR}$ by 1 to 2 times the conducting voltage $V_{be}$ for at least one transistor Q3 within the supply voltage rejection circuit 28, transistor Q3 is saturated. Transistor Q3 and other portions of the supply voltage rejection circuit 28 are best illustrated with reference to FIG. 2.

Referring now to FIG. 3a, a graph illustrating a rate of decrease of the supply voltage $V_{CC}$, the supply voltage rejection signal $V_{SVR}$, and the audio output signal $V_{OUT}$ at power-off of the power supply 22 is provided. As discussed above, when the supply voltage $V_{CC}$ is larger than $V_{SVR}$ by 1 to 2 times the conducting voltage $V_{be}$ for transistor Q3 within the supply voltage rejection circuit 28, transistor Q3 is saturated.

When transistor Q3 is saturated during power-off, ripples present in the power supply 22 are fed into the supply voltage rejection circuit 28 and amplified by transistors Q4 and Q5. As a result, the loud popping noise during power-off can be heard at the output of the amplifier 20 via the speaker 24 connected thereto. FIG. 3b is an expanded graph of the audio output signal $V_{OUT}$ illustrated in FIG. 3a to highlight the noise present during power-off of the power supply 22. An audio amplifier that is not associated with this popping characteristic is thus desirable.

SUMMARY OF THE INVENTION

In view of the foregoing background, it is an object of the present invention to minimize or reduce audio amplifier noise during power-off.

This and other objects, features and advantages in accordance with the present invention are provided by an audio amplifier device comprising a power supply including an output for providing a supply voltage, and a voltage divider connected to the output of the power supply for providing a divided supply voltage, and an audio amplifier. The audio amplifier preferably comprises a supply voltage rejection circuit and includes a first input for receiving an input audio signal, a second input for receiving the supply voltage, a third input for receiving a supply voltage rejection signal for the supply voltage rejection circuit, and an output for providing an output audio signal. A speaker is preferably connected to the output of the audio amplifier.

The audio amplifier device preferably further comprises a power-off noise suppression circuit having a first input for receiving the divided supply voltage and an output for providing the supply voltage rejection signal. The power-off noise suppression circuit preferably sets the supply voltage rejection signal equal to the divided supply voltage during power-off of the power supply so that a rate of decrease of the supply voltage is greater than a rate of decrease of the supply voltage rejection signal for reducing noise in the output audio signal during the power-off.

Because the supply voltage rejection signal is set equal to the divided supply voltage during power-off, the rate of decrease of the supply voltage is maintained so that it is greater than the rate of decrease of the supply voltage rejection signal. This advantageously prevents at least one transistor in the supply voltage rejection circuit from being saturated. Saturation of this transistor causes the popping noise to be heard at the output of the speaker during power-off of the power supply.

In one embodiment, the power-off noise suppression circuit includes a second input connected to the output thereof so that the power-off noise suppression circuit is configured as a voltage follower. The power-off noise suppression circuit preferably comprises a pair of first and second transistors each comprising a first conduction terminal connected to the power supply.

The first transistor preferably comprises a control terminal connected to the first input of the power-off noise suppression circuit, and the second transistor comprises a control terminal connected to the third input of the audio amplifier for providing the supply voltage rejection signal. A device is preferably connected to the pair of first and second transistors and is operated when the divided supply voltage is greater than the supply voltage rejection signal during power-off so that the supply voltage rejection signal is set equal to the divided supply voltage. In one embodiment, the device preferably comprises a transistor.

Another aspect of the invention relates to a method for reducing noise in an output audio signal during power-off of an audio amplifier device comprising an audio amplifier that includes an amplifier and a supply voltage rejection circuit. The audio amplifier device includes a first input for receiving an input audio signal, a second input for receiving a supply voltage, a third input for receiving a supply voltage rejection signal for the supply voltage rejection circuit, and an output for providing the output audio signal.

The method includes turning off the power supply for powering-off the audio amplifier device, and dividing the supply voltage into a divided supply voltage. The method further includes setting the supply voltage rejection signal equal to the divided supply voltage during power-off so that a rate of decrease of the supply voltage is greater than a rate of decrease of the supply voltage rejection signal.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 4:
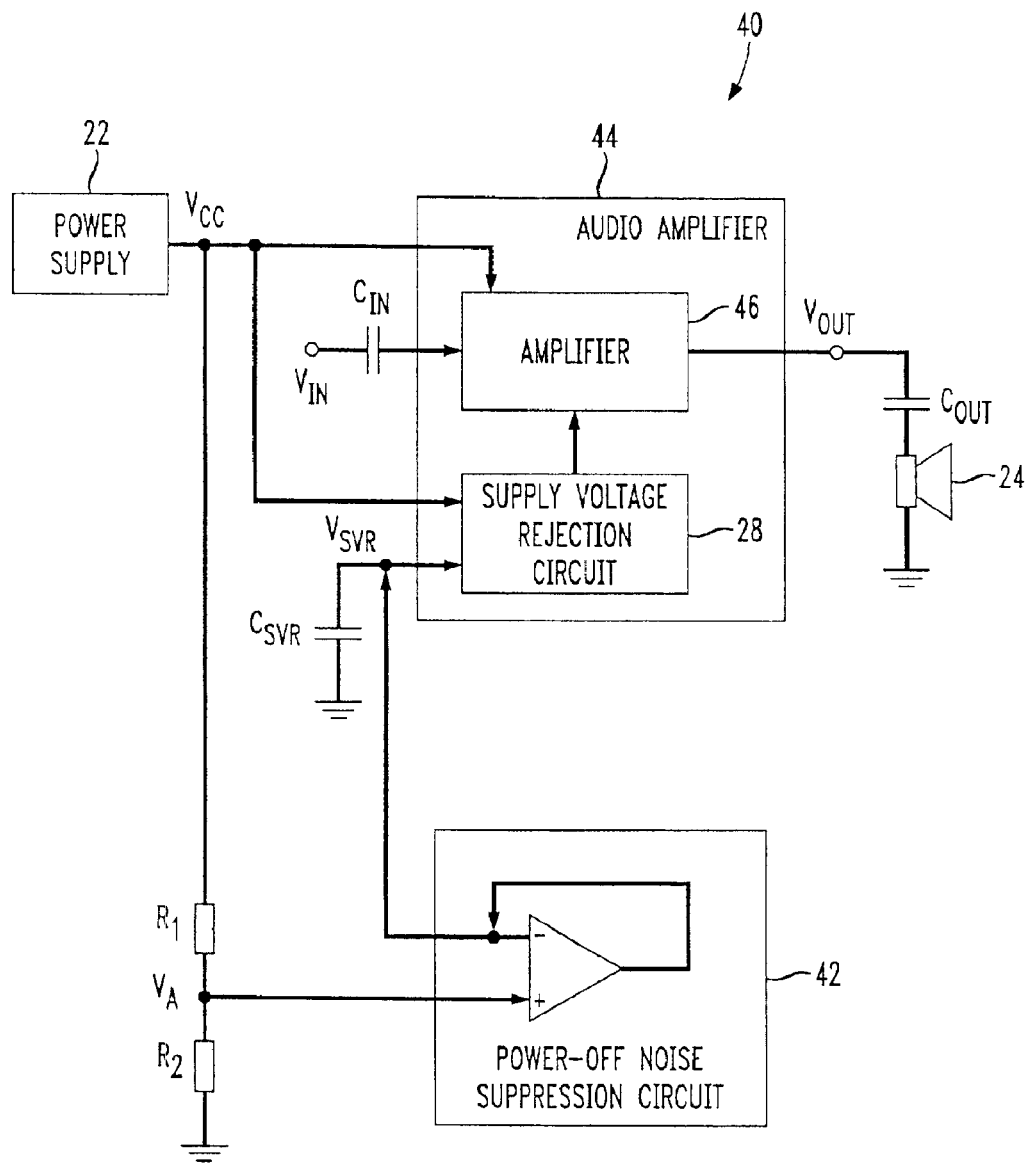
FIG. 4 is a schematic diagram of an audio amplifier device with a power-off noise suppression circuit in accordance with the present invention.

Referring initially to FIG. 4, an audio amplifier device 40 with a power-off noise suppression circuit 42 in accordance with the present invention will now be described. The audio amplifier device 40 comprises a power supply 22 including an output for providing a supply voltage $V_{CC}$, and a voltage divider connected to the output of the power supply for providing a divided supply voltage $V_A$. The voltage divider may be formed by two resistors $R_1$ and $R_2$, for example.

The audio amplifier device 40 also comprises an audio amplifier 44 that includes an amplifier 46 and a supply voltage rejection circuit 28. The audio amplifier 46 is a Class B amplifier, for example, as readily understood by one skilled in the art. A speaker 24 is connected to the output of the audio amplifier 44.

The audio amplifier 44 includes a first input for receiving an input audio signal $V_I$, a second input for receiving the supply voltage $V_{CC}$, a third input for receiving a supply voltage rejection signal $V_{SVR}$ for the supply voltage rejection circuit 28, and an output for providing an output audio signal $V_{OUT}$.

The audio amplifier device 40 further includes the power-off noise suppression circuit 42 having a first input for receiving the divided supply voltage $V_A$ and an output for providing the supply voltage rejection signal $V_{SVR}$. The power-off noise suppression circuit 42 sets the supply voltage rejection signal $V_{SVR}$ equal to the divided supply voltage $V_A$ during power-off of the power supply 22 so that a rate of decrease of the supply voltage $V_{CC}$ is greater than a rate of decrease of the supply voltage rejection signal for reducing noise in the output audio signal $V_{OUT}$ during the power-off.

Figure 1:
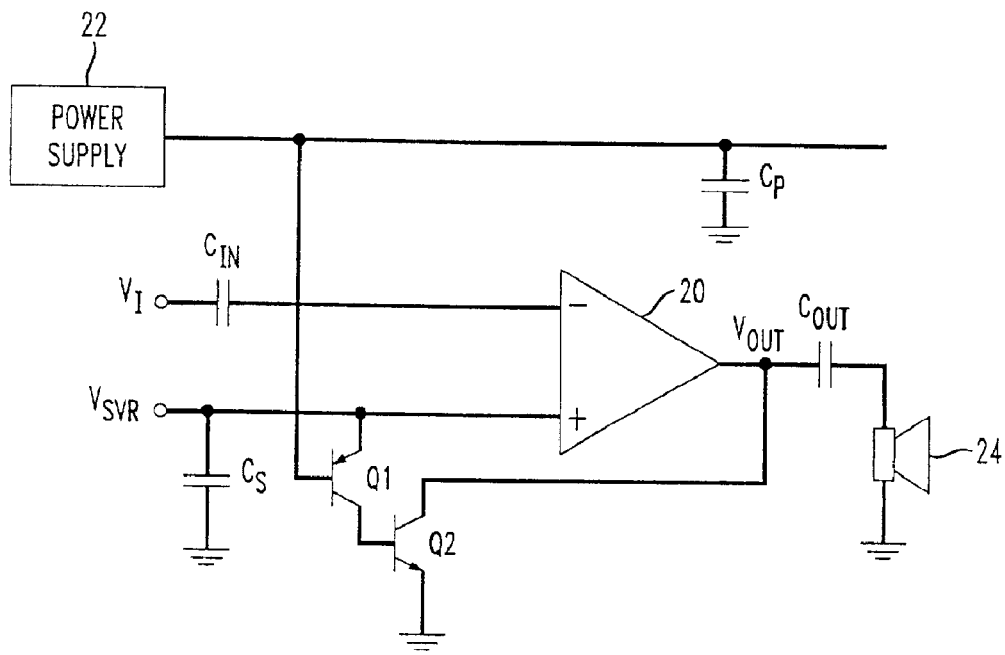
FIG. 1 is a schematic diagram of an audio amplifier with an external pair of transistors for minimizing noise during power-off of the power supply in accordance with the prior art.
Figure 2:
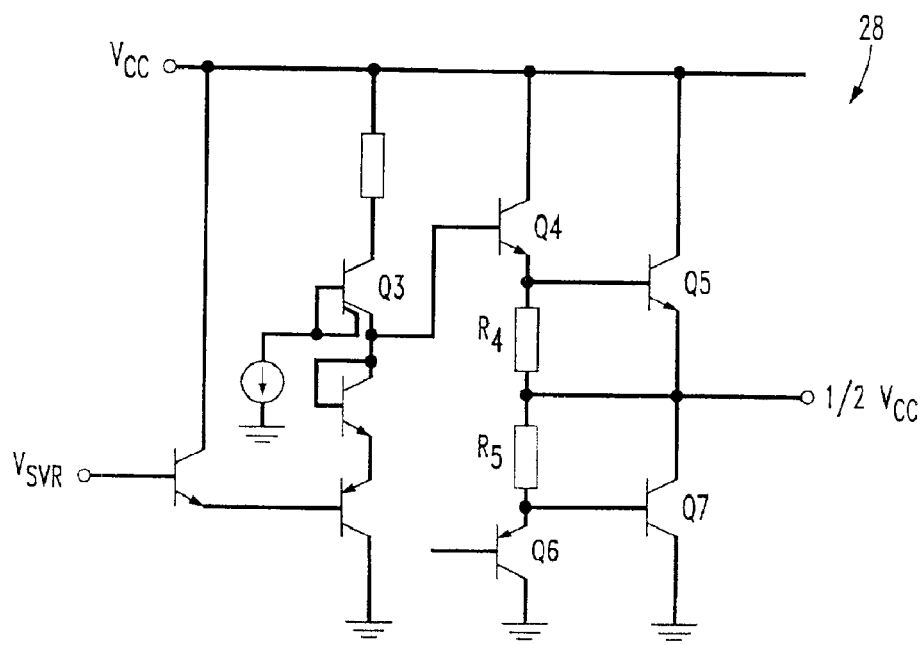
FIG. 2 is a schematic diagram of a supply voltage rejection circuit that is internal to the audio amplifier illustrated in FIG. 1.
Figure 3A:
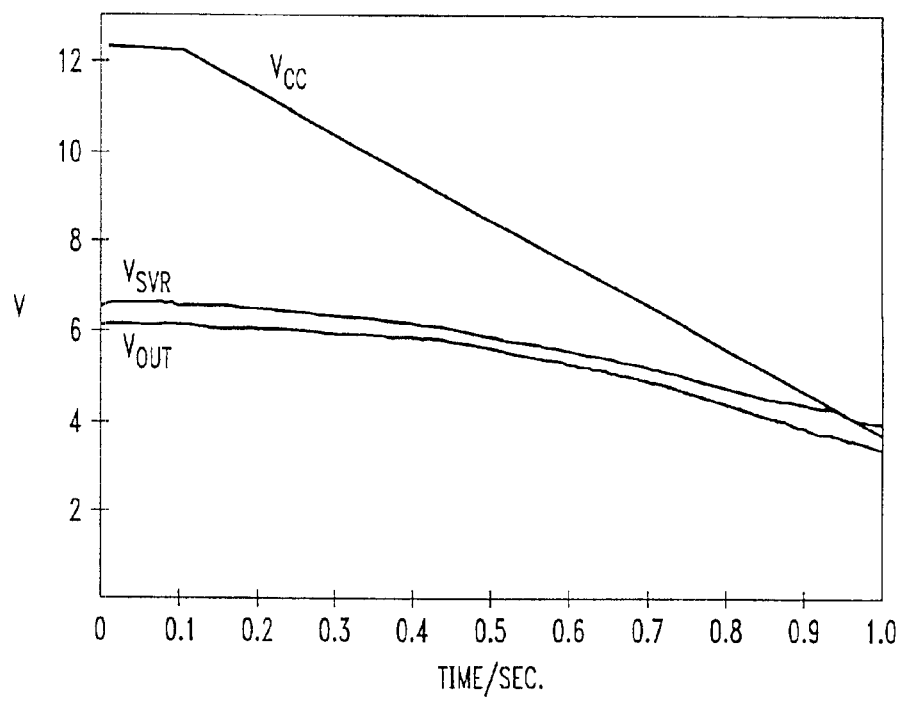
FIG. 3a is a graph illustrating the supply voltage, the supply voltage rejection signal and the audio output signal at power-off of the power supply in accordance with the prior art.
Figure 3B:
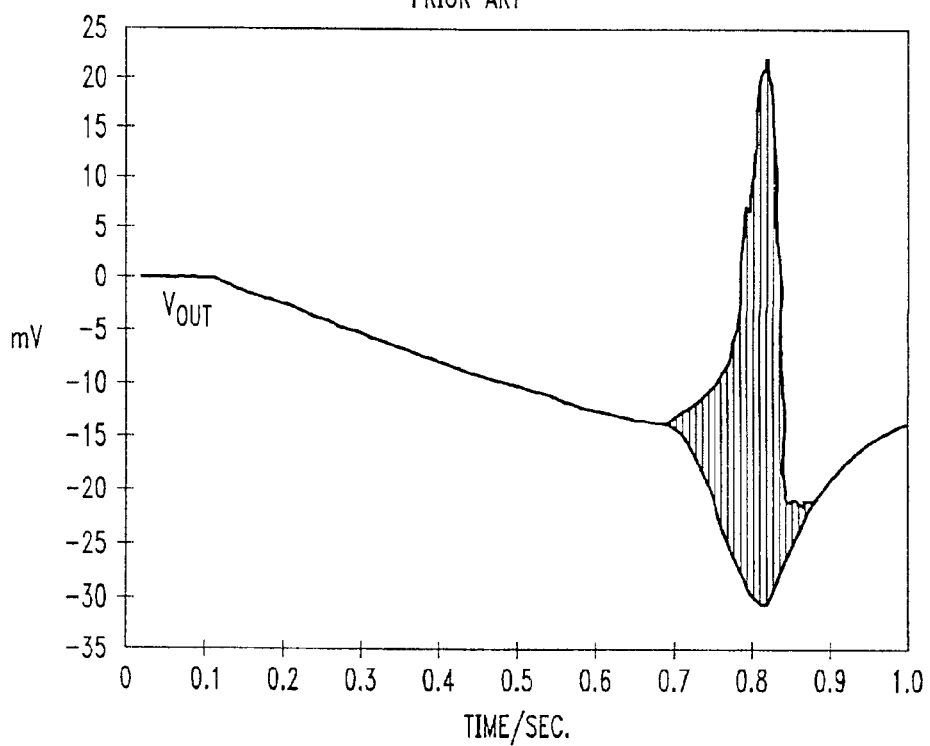
FIG. 3b is an expanded graph of the audio output signal illustrated in FIG. 3a to highlight the noise present during power-off of the power supply.

As discussed above, the supply voltage rejection circuit 28 includes at least one transistor Q3 that is saturated when the supply voltage $V_{CC}$ does not decrease as fast as the supply voltage rejection signal $V_{SVR}$. This results in the popping noise being heard through the speaker 24 during power-off, as best illustrated with reference to FIG. 3b.

Powering-off of the power supply 22 thus sets equal the supply voltage rejection signal $V_{SVR}$ to the divided supply voltage $V_{CC}$ so that the rate of decrease of the supply voltage is maintained so that it is greater than the rate of decrease of the supply voltage rejection signal. This advantageously prevents transistor Q3 in the supply voltage rejection circuit 28 from being saturated. Saturation of transistor Q3 causes the popping noise to be heard at the output of the speaker 24 during power-off of the power supply 22.

Figure 5:
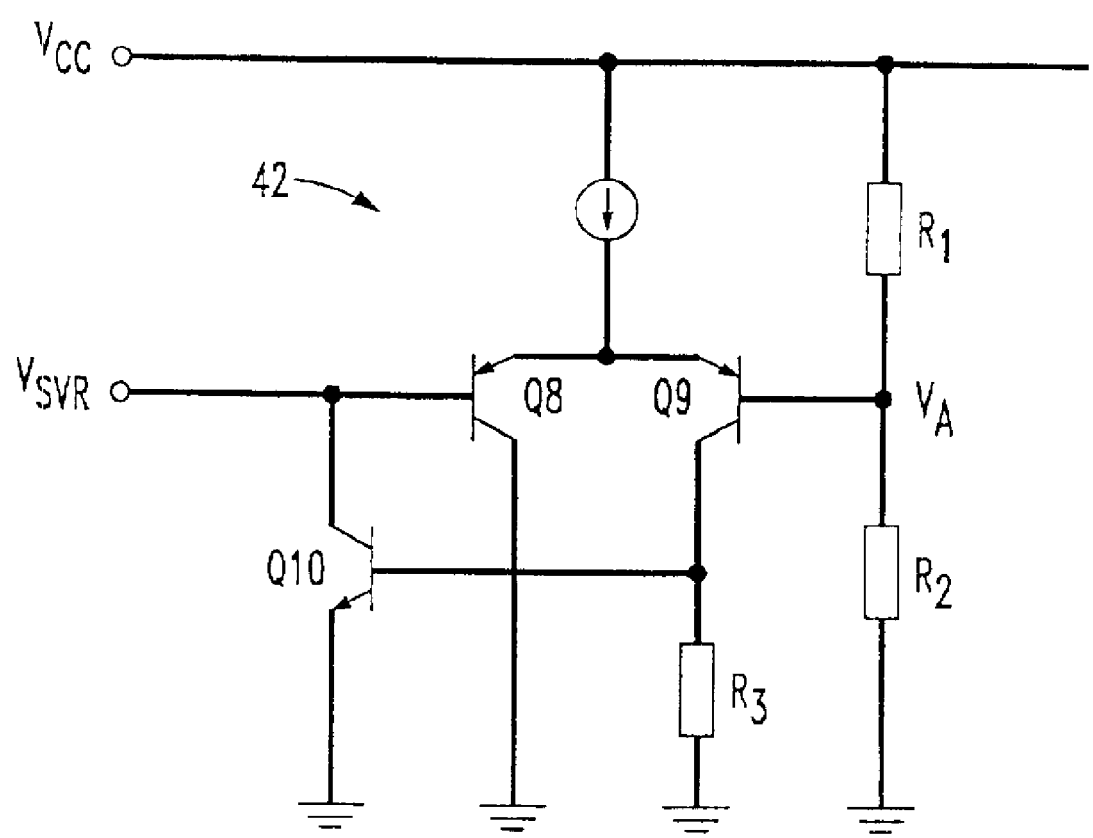
FIG. 5 is a schematic diagram of the power-off noise suppression circuit illustrated in FIG. 4.

In one embodiment, the power-off noise suppression circuit 42 includes a second input connected to the output thereof so that the power-off noise suppression circuit is configured as a voltage follower. The power-off noise suppression circuit 42 comprises a pair of first and second transistors Q8 and Q9 connected together. As illustrated in FIG. 5, the pair of first and second transistors Q8 and Q9 are PNP transistors, for example.

Each of these transistors includes a first conduction terminal connected in common to the power supply 22. The first transistor Q9 comprises a control terminal connected to the first input of the power-off noise suppression circuit 42, and the second transistor Q8 comprises a control terminal connected to the third input of the audio amplifier 44 for providing the supply voltage rejection signal $V_{SVR}$.

A device Q10 is connected to the pair of first and second transistors Q8 and Q9 and is operated when the divided supply voltage $V_A$ is greater than the supply voltage rejection signal $V_{SVR}$ during power-off so that the supply voltage rejection signal is set equal to the divided supply voltage. As illustrated in FIG. 5, the device Q10 may be a transistor, such as an NPN transistor, for example. The power-off noise suppression circuit 42 further comprises a bias circuit R3 connected to the device Q10. This bias circuit R3 may be a resistor, for example.

As discussed above, the power-off noise suppression circuit 42 includes a second input connected to the output thereof so that the power-off noise suppression circuit may be configured as a voltage follower. In this way, the power-off noise suppression circuit 42 can force $V_{SVR}=V_A$. With respect to the voltage divider providing the divided supply voltage $V_A$, and assuming that $R_2=K*R_1$, then $$V_A = \frac{K \times V_{CC}}{K+1}$$

Figure 6A:
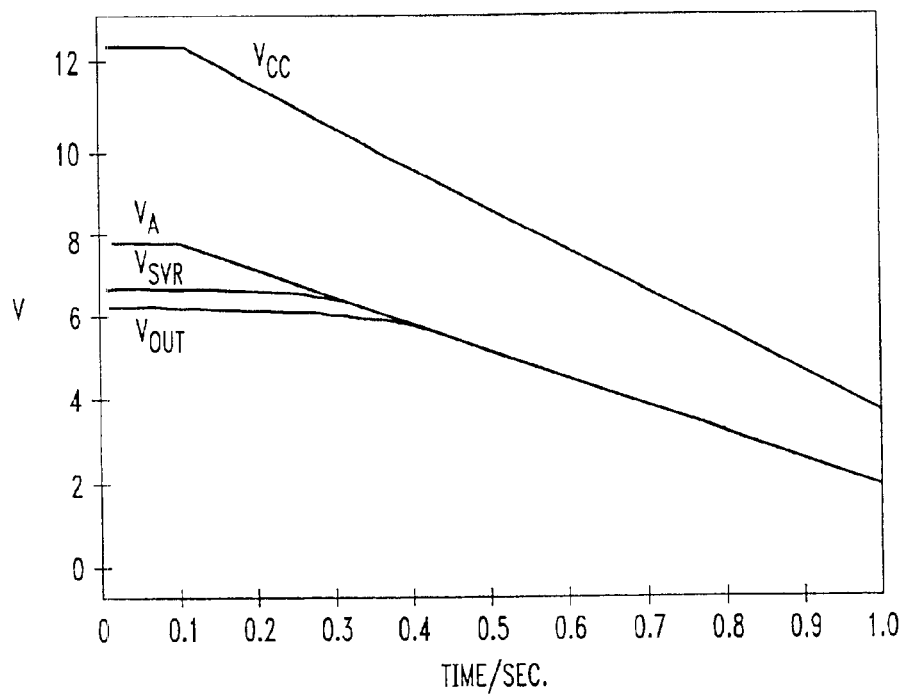
FIG. 6a is a graph illustrating the supply voltage, the divided supply voltage, the supply voltage rejection signal and the audio output signal at power-off of the power supply in accordance with the present invention.

When the power supply 22 is switched off, the divided supply voltage $V_A$ goes down with the power supply $V_{CC}$ until $V_A=V_{SVR}$, as best shown in FIG. 6a. Then the supply voltage rejection voltage $V_{SVR}$ will follow the divided supply voltage $V_A$. Hence:

$$V_{CC} - V_{SVR} = V_{CC} - \frac{K \times V_{CC}}{K+1} = \frac{V_{CC}}{K+1}$$

Figure 6B:
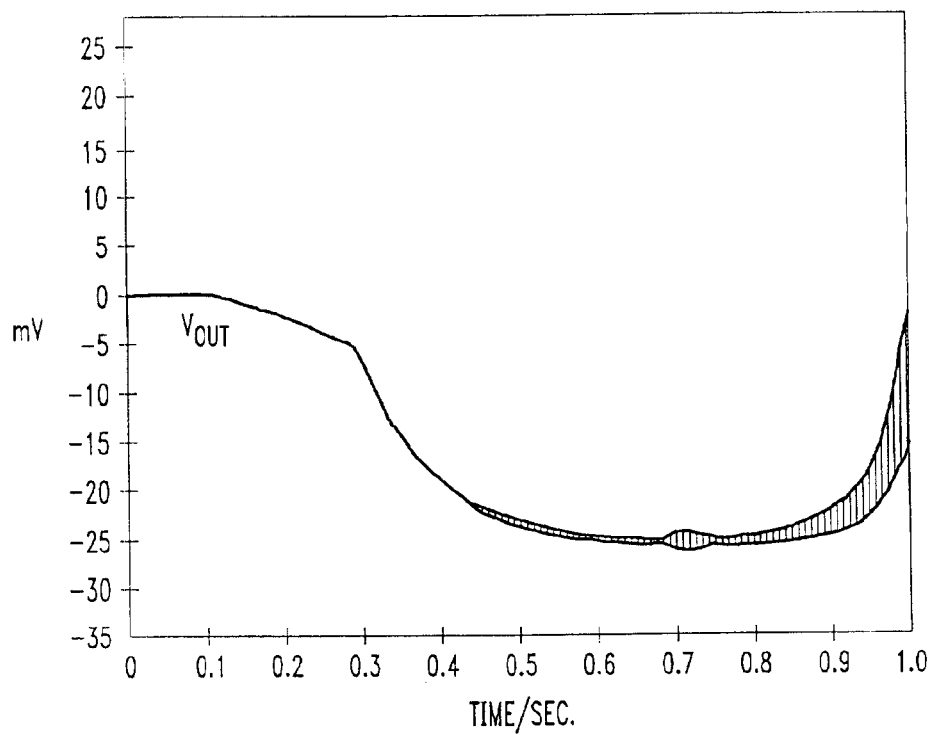
FIG. 6b is an expanded graph of the audio output signal illustrated in FIG. 6a to highlight the noise present during power-off of the power supply.

An appropriate K can be selected such that $$\frac{V_{CC}}{K+1} > 2V_{be}$$

and, hence transistor Q3 is kept out of saturation. The rate of decrease of the supply voltage $V_{CC}$ is preferably greater than the rate of decrease of the supply voltage rejection signal $V_{SVR}$ by at least the conducting voltage of transistor Q3. Consequently, ripples present in the power supply 22 cannot feed into the supply voltage rejection circuit 28, and the audible noise at the output can be minimized, as best shown in FIG. 6b.

Another aspect of the invention relates to a method for reducing noise in an output audio signal $V_{OUT}$ during power-off of an audio amplifier device 40 comprising an audio amplifier 44 that includes an amplifier 46 and a supply voltage rejection circuit 28. The audio amplifier device 40 includes a first input for receiving an input audio signal $V_I$, a second input for receiving a supply voltage $V_{CC}$, a third input for receiving a supply voltage rejection signal $V_{SVR}$ for the supply voltage rejection circuit 28, and an output for providing the output audio signal $V_{OUT}$.

The method includes turning off the power supply 22 for powering-off the audio amplifier device 40, and dividing the supply voltage $V_{CC}$ into a divided supply voltage $V_A$. The method further includes setting the supply voltage rejection signal $V_{SVR}$ equal to the divided supply voltage $V_A$ during power-off so that a rate of decrease of the supply voltage $V_{SVR}$ is greater than a rate of decrease of the supply voltage rejection signal.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An audio amplifier device comprising:

a power supply including an output for providing a supply voltage;

a voltage divider connected to the output of said power supply for providing a divided supply voltage;

an audio amplifier comprising a supply voltage rejection circuit and including a first input for receiving an input audio signal, a second input for receiving the supply voltage, a third input for receiving a supply voltage rejection signal for said supply voltage rejection circuit, and an output for providing an output audio signal; and a speaker connected to the output of said audio amplifier; and a power-off noise suppression circuit having a first input for receiving the divided supply voltage and an output for providing the supply voltage rejection signal, said power-off noise suppression circuit setting the supply voltage rejection signal equal to the divided supply voltage during power-off of said power supply so that a rate of decrease of the supply voltage is greater than a rate of decrease of the supply voltage rejection signal.

2. An audio amplifier device according to claim 1 wherein said supply voltage rejection circuit comprises at least one transistor having a conducting voltage; and wherein the rate of decrease of the supply voltage and the rate of decrease of the supply voltage rejection signal cause an instantaneous supply voltage to be greater than an instantaneous supply voltage rejection signal by at least the conducting voltage.

3. An audio amplifier device according to claim 1 wherein said power-off noise suppression circuit includes a second input connected to the output thereof so that said power-off noise suppression circuit is configured as a voltage follower.

4. An audio amplifier device according to claim 1 wherein said power-off noise suppression circuit comprises:

a pair of first and second transistors each comprising a first conduction terminal connected to said power supply, said first transistor comprising a control terminal connected to the first input of said power-off noise suppression circuit and said second transistor comprising a control terminal connected to the third input of said audio amplifier for providing the supply voltage rejection signal; and a device connected to said pair of first and second transistors and being operated so that the supply voltage rejection signal is set equal to the divided supply voltage.

5. An audio amplifier device according to claim 4 wherein said power-off noise suppression circuit further comprises a bias circuit connected to said device.

6. An audio amplifier device according to claim 5 wherein said bias circuit comprises a resistor.

7. An audio amplifier device according to claim 4 wherein said device comprises a transistor.

8. An audio amplifier device according to claim 7 wherein said device comprises an NPN transistor.

9. An audio amplifier device according to claim 4 wherein said pair of first and second transistors each comprises a PNP transistor.

10. An audio amplifier device according to claim 1 wherein said audio amplifier is a Class B amplifier.

11. An audio amplifier device comprising:

an audio amplifier comprising a supply voltage rejection circuit and including a first input for receiving an input audio signal, a second input for receiving a supply voltage, a third input for receiving a supply voltage rejection signal for said supply voltage rejection circuit, and an output for providing an output audio signal; and a power-off noise suppression circuit having a first input for receiving a divided supply voltage, an output for providing the supply voltage rejection signal, and a second input connected to the output so that said power-off noise suppression circuit is configured as a voltage follower, said power-off noise suppression circuit setting the supply voltage rejection signal equal to the divided supply voltage during power-off so that a rate of decrease of the supply voltage is greater than a rate of decrease of the supply voltage rejection signal.

12. An audio amplifier device according to claim 11 further comprising:

a power supply including an output for providing the supply voltage; and a voltage divider connected to the output of said power supply for providing the divided supply voltage.

13. An audio amplifier device according to claim 11 further comprising a speaker connected to the output of said audio amplifier.

14. An audio amplifier device according to claim 11 wherein said supply voltage rejection circuit comprises at least one transistor having a conducting voltage; and wherein the rate of decrease of the supply voltage and the rate of decrease of the supply voltage rejection signal cause an instantaneous supply voltage to be greater than an instantaneous supply voltage rejection signal by at least the conducting voltage.

15. An audio amplifier device according to claim 11 wherein said power-off noise suppression circuit comprises:
a pair of first and second transistors each comprising a first conduction terminal for receiving the supply voltage, said first transistor comprising a control terminal connected to the first input of said power-off noise suppression circuit and said second transistor comprising a control terminal connected to the third input of said audio amplifier for providing the supply voltage rejection signal; and
a device connected to said pair of first and second transistors and being operated so that the supply voltage rejection signal during is set equal to the divided supply voltage.

16. An audio amplifier device according to claim 15 wherein said power-off noise suppression circuit further comprises a bias circuit connected to said switch.

17. An audio amplifier device according to claim 16 wherein said bias circuit comprises a resistor.

18. An audio amplifier device according to claim 15 wherein said device comprises a transistor.

19. An audio amplifier device according to claim 18 wherein said device comprises an NPN transistor.

20. An audio amplifier device according to claim 15 wherein said pair of first and second transistors each comprises a PNP transistor.

21. An audio amplifier device according to claim 11 wherein said audio amplifier is a Class B amplifier.

22. A method for reducing noise in an output audio signal during power-off of an audio amplifier device comprising an audio amplifier and a supply voltage rejection circuit, the audio amplifier device including a first input for receiving an input audio signal, a second input for receiving a supply voltage, a third input for receiving a supply voltage rejection signal for the supply voltage rejection circuit, and an output for providing the output audio signal, the method comprising:
turning off the power supply for powering-off the audio amplifier device;
dividing the supply voltage into a divided supply voltage; and
setting the supply voltage rejection signal equal to the divided supply voltage during power-off so that a rate of decrease of the supply voltage is greater than a rate of decrease of the supply voltage rejection signal.

23. A method according to claim 22 wherein the supply voltage rejection circuit comprises at least one transistor having a conducting voltage; and wherein the rate of decrease of the supply voltage and the rate of decrease of the supply voltage rejection signal causes an instantaneous supply voltage to be greater than an instantaneous supply voltage rejection signal by at least the conducting voltage.

24. A method according to claim 22 wherein setting the supply voltage rejection signal equal to the divided supply voltage during power-off is performed using a power-off noise suppression circuit that includes a first input receiving the divided supply voltage, an output providing the supply voltage rejection signal, and a second input connected to the output so that the power-off noise suppression circuit is configured as a voltage follower.

25. A method according to claim 24 wherein the power-off noise suppression circuit comprises:
a pair of first and second transistors each comprising a first conduction terminal connected to the power supply, the first transistor comprising a control terminal connected to the first input of the power-off noise suppression circuit and the second transistor comprising a control terminal connected to the third input of the audio amplifier for providing the supply voltage rejection signal; and
a device connected to the pair of first and second transistors and being operated so that the supply voltage rejection signal is set equal to the divided supply voltage.

26. A method according to claim 25 further comprising biasing the device.

27. A method according to claim 25 wherein the device comprises a transistor.

28. A method according to claim 22 wherein the audio amplifier is a Class B amplifier.

* * * * *